(12) United States Patent
Akiba et al.

(10) Patent No.: US 9,274,420 B2
(45) Date of Patent: Mar. 1, 2016

(54) METHOD OF STABILIZING FLUORINE-CONTAINING ACID AMPLIFIER

(71) Applicant: Central Glass Company, Limited, Ube-shi, Saitama (JP)

(72) Inventors: Shinya Akiba, Kawagoe (JP); Ryo Nadano, Kawagoe (JP); Robert L. Brainard, New York, NY (US)

(73) Assignees: Central Glass Company, Limited, Ube-shi (JP); The Research Foundation for the University of New York, Albany, NY (US)

( * ) Notice: Subject to any disclaimer, the term of this patent is extended or adjusted under 35 U.S.C. 154(b) by 0 days.

(21) Appl. No.: 14/012,188

(22) Filed: Aug. 28, 2013

(65) Prior Publication Data
US 2014/0065541 A1 Mar. 6, 2014

(30) Foreign Application Priority Data

Aug. 31, 2012 (JP) .................................. 2012-190942
Oct. 30, 2012 (JP) .................................. 2012-238603

(51) Int. Cl.
*G03F 7/004* (2006.01)

(52) U.S. Cl.
CPC .................................. *G03F 7/0045* (2013.01)

(58) Field of Classification Search
None
See application file for complete search history.

(56) References Cited

U.S. PATENT DOCUMENTS

| 2012/0258399 | A1 | 10/2012 | Maruyama |
| 2014/0093823 | A1* | 4/2014 | Brainard et al. ........... 430/283.1 |
| 2014/0193752 | A1* | 7/2014 | Brainard et al. ........... 430/283.1 |

FOREIGN PATENT DOCUMENTS

| JP | 2011070147 A | * | 4/2011 |
| TW | 201131303 A1 | | 9/2011 |
| TW | 201139351 A1 | | 11/2011 |

OTHER PUBLICATIONS

Machine translation JP 2011-070147. Apr. 7, 2011.*
Taiwanese Office Action dated Aug. 6, 2014 (Four (4) pages).
Hosoi et al, "Fluorine-Stabilized Acid Amplifiers for Use in EUV Lithography," Journal of Photopolymer Science and Technology, 2012, pp. 575-581, vol. 25, No. 5.
Kruger et al., "Stable, Fluorinated Acid Amplifiers for Use in EUV Lithography," Proceedings of SPIE, 2012, pp. 832514-1-832514-13, vol. 8325.

* cited by examiner

*Primary Examiner* — Cynthia H Kelly
*Assistant Examiner* — Alyssa L Cepluch
(74) *Attorney, Agent, or Firm* — Crowell & Moring LLP

(57) ABSTRACT

A method of stabilizing a fluorine-containing acid amplifier. The method is provided to include the step of dissolving a fluorine-containing acid amplifier in an organic solvent thereby producing a solution of the fluorine-containing acid amplifier, the fluorine-containing acid amplifier being represented by general formula (1):

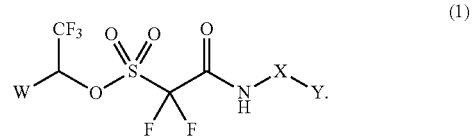

(1)

14 Claims, No Drawings

METHOD OF STABILIZING FLUORINE-CONTAINING ACID AMPLIFIER

BACKGROUND OF THE INVENTION

The present invention relates to a method of stabilizing a fluorine-containing acid amplifier.

With the recent development of digital devices such as computers, it has become common to process an enormous amount of operational data or two- or three-dimensional image data. There is a need to provide large-capacity high-speed memories and high-performance microprocessors for quick processing of such enormous information. Further, the processing power required of the digital devices is estimated to increase more and more as the broadband spreads with the development of network systems such as the Internet.

In order to meet this need, various devices such as semiconductor devices are required to achieve higher density and higher integration. The requirements for photolithography processes, which enable fine patterning, are particularly becoming more stringent year by year. For example, photolithography process using ArF excimer laser radiation (wavelength: 193 nm) has been put into use in response to the requirement for patterning techniques with a minimum line width of 0.13 μm or less for production of 1 Gbit or higher-capacity DRAMs. The development of photolithography process using extreme ultraviolet (EUV) radiation has also been pursued for finer patterning.

For the purpose of improving line edge roughness in these wavelength regions, studies of additives for photoresists such as photoacid generators had been eagerly made. In extreme ultraviolet (EUV) region, however, it is sometimes difficult to sufficiently improve line edge roughness only by photoacid generators because of poor energy from light source. In response to the increasing requirements for finer patterning by photoresist, there have been reported such fluorine-containing acid amplifiers as to form a secondary acid from acid generated by a photoacid generator thereby allowing improvement of line edge roughness of photoresist pattern (Non-Patent Publications 1 and 2).

REFERENCES ABOUT PRIOR ART

Non-Patent Publication

Non-Patent Publication 1: Journal of Photopolymer Science and Technology, Vol. 25, No. 5 (2012), pp. 575-581

Non-Patent Publication 2: Proceedings of SPIE Vol. 8325 (, 2012), pp. 832514-1 to 832514-13

SUMMARY OF THE INVENTION

However, these fluorine-containing acid amplifiers are designed to cause autolysis in the presence of acid that they generate by themselves, so that decomposition is to develop in a chainlike manner if once it is initiated. Accordingly, it has hitherto been required to secure the stability of an acid amplifier in itself and to establish a method for stabilizing the acid amplifier. Non-Patent Publications 1 and 2 discuss fluorine-containing acid amplifiers, but actually these documents do not refer to the storage stability at all rather than study it. In view of the above, an object of the present invention is to provide: a method of stabilizing a fluorine-containing acid amplifier useful for forming finer photoresist patterns, which method allowing a stable storage of the fluorine-containing acid amplifier; and a fluorine-containing acid amplifier composition suitable therefor.

The present inventors carried out examinations on the fluorine-containing acid amplifier. Then, it became evident that the fluorine-containing acid amplifier in a state of solid sometimes decomposed even in storage in a cool, dry, dark place (see Comparative Example 1). In view of the above, the present inventors eagerly made studies on the above problems and resulted in a finding that the fluorine-containing acid amplifier is stabilized when dissolved in a specified solvent to become a solution and that the composition exhibit a good storage stability over a long period of time, with which the present invention has been established.

More specifically, the present invention involves the following inventions.

[Invention 1]

A method of stabilizing a fluorine-containing acid amplifier, comprising the steps of:

dissolving a fluorine-containing acid amplifier in an organic solvent thereby producing a solution of the fluorine-containing acid amplifier, the fluorine-containing acid amplifier being represented by general formula (1):

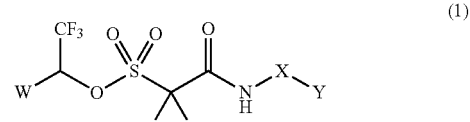

In the formula:

W represents a $C_1$-$C_{20}$ straight-chain or branched saturated or unsaturated hydrocarbon group or a $C_3$-$C_{20}$ cyclic saturated or unsaturated hydrocarbon group, both of which may have a substituent, and X represents a direct bond, —$(CR^A R^A)_m(O)_n(C=O)_p$— or —$R^B(O)_q(C=O)_r$— where: $R^A$ mutually independently represents a hydrogen atom, a $C_1$-$C_6$ alkyl group or a phenyl group; $R^B$ represents a phenylene group or cyclohexylene group in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; r is an integer of 0 or 1.

Y is selected from formulas (a) and (b) and (c):

(a) —$C(=CH_2)Z$ (where Z represents a hydrogen atom, fluorine atom, $CH_3$ group or $CF_3$ group);

(b) —$C_d H_e F_f$ (where d is an integer of 1 to 15, e is an integer of 0 to 30, f is an integer of 1 to 31, and the total of e and f is 2 d+1); and (c) a $C_3$-$C_{12}$ cyclic saturated or unsaturated hydrocarbon group which may have a substituent.

[Invention 2]

A method of stabilizing a fluorine-containing acid amplifier, as discussed in Invention 1, wherein a moiety indicated with W in the fluorine-containing acid amplifier represented by general formula (1) has a structure represented by the following formulas:

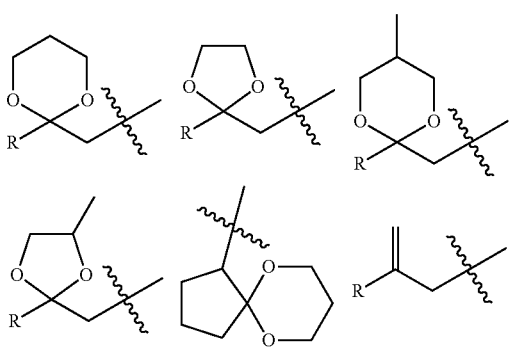

In the formula, R represents a $C_1$-$C_{18}$ straight-chain or branched saturated or unsaturated hydrocarbon group which may have a substituent, and a line segment accompanied with a wavy line represents a binding site.

[Invention 3]

A method of stabilizing a fluorine-containing acid amplifier, as discussed in Invention 1, wherein a moiety indicated with X—Y in the fluorine-containing acid amplifier represented by general formula (1) has a structure represented by the following formulas:

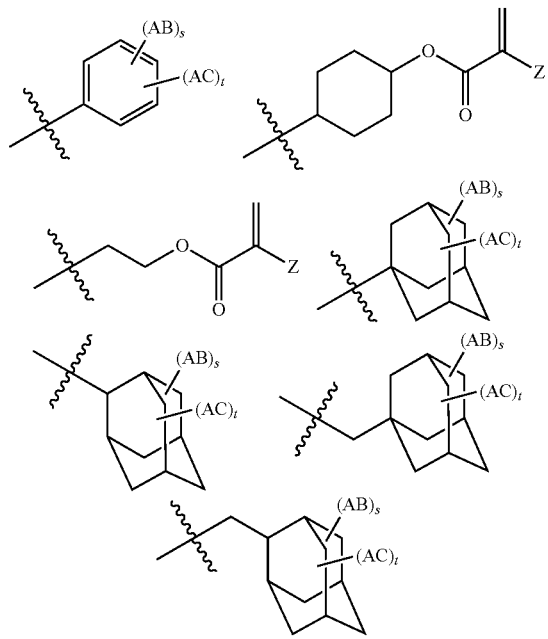

In the formula:

AB represents —C(=O)$OCH_3$ group, —OC(=O)$CH_3$ group, —C(=O)$CH_3$ group, —CN group, —CH=$CH_2$ group, —OC(=O)CH(=$CH_2$) group or —OC(=O)$CCH_3$(=$CH_2$) group, AC represents —$CF_3$ group, —OH group, —$OCH_3$ group, —C=O(oxo) group, $C_1$-$C_4$ alkyl group, —$NO_2$ group, fluorine atom or a $C_1$-$C_4$ alkyl group any number of hydrogen atoms of which are substituted with fluorine atoms, s which represents the number of AB is an integer of 0 or 1, t which represents the number of AC is an integer of 0 to 5, the total of s and t meets an integer of 0 to 5, and a line segment accompanied with a wavy line represents a binding site.

[Invention 4]

A method of stabilizing a fluorine-containing acid amplifier, as discussed in Invention 1, wherein the organic solvent is at least one kind selected from the group consisting of aliphatic hydrocarbons, aromatic hydrocarbons, halogenated hydrocarbons, alcohols, ketones, cyclic ketones, polyalcohols, polyalcohol derivatives, cyclic ethers, chain ethers, esters, sulfonyl esters, amides, aromatic solvents and fluorine-based solvents.

[Invention 5]

A method of stabilizing a fluorine-containing acid amplifier, as discussed in Invention 1, wherein the fluorine-containing acid amplifier contained in the solution of the fluorine-containing acid amplifier has a concentration of 0.05 to 90 mass %.

[Invention 6]

A method of stabilizing a fluorine-containing acid amplifier, as discussed in Invention 1, further comprising the step of:

adding an additive to the solution of the fluorine-containing acid amplifier.

[Invention 7]

A method of stabilizing a fluorine-containing acid amplifier, as discussed in Invention 6, wherein the additive is a basic compound or an antioxidant.

[Invention 8]

A method of stabilizing a fluorine-containing acid amplifier, as discussed in Invention 7, wherein the basic compound is at least one kind selected from the group consisting of primary, secondary or tertiary aliphatic amines, aromatic amines, heterocyclic amines, nitrogen-containing compounds having hydroxyphenyl group, alcoholic nitrogen-containing compounds and amide derivatives.

[Invention 9]

A method of stabilizing a fluorine-containing acid amplifier, as discussed in Invention 6, wherein the additive has a concentration of 0.001 to 10 mass % relative to the fluorine-containing acid amplifier.

[Invention 10]

A method of stabilizing a fluorine-containing acid amplifier, as discussed in Invention 1, wherein a storage temperature is −30 to +50° C.

[Invention 11]

A solution of a fluorine-containing acid amplifier, comprising:

a fluorine-containing acid amplifier; and an organic solvent, wherein the fluorine-containing acid amplifier is represented by general formula (1):

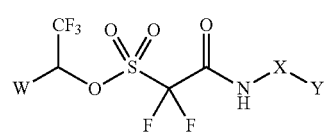

(1)

In the formula:

W represents a $C_1$-$C_{20}$ straight-chain or branched saturated or unsaturated hydrocarbon group or a $C_3$-$C_{20}$ cyclic saturated or unsaturated hydrocarbon group, both of which may have a substituent, and X represents a direct bond, —$(CR^A R^A)_m(O)_n(C=O)_p$— or —$R^B(O)_q(C=O)_r$— where: $R^A$ mutually independently represents a hydrogen atom, a $C_1$-$C_6$ alkyl group or a phenyl group; $R^B$ represents a phenylene group or a cyclohexylene group, in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; r is an integer of 0 or 1.

Y is selected from formulas (a) and (b) and (c):

(a) —C(=$CH_2$)Z (where Z represents a hydrogen atom, fluorine atom, $CH_3$ group or $CF_3$ group);

(b) —$C_dH_eF_f$ (where d is an integer of 1 to 15, e is an integer of 0 to 30, f is an integer of 1 to 31, and the total of e and f is 2 d+1); and (c) a $C_3$-$C_{12}$ cyclic saturated or unsaturated hydrocarbon group which may have a substituent.

[Invention 12]

A solution of a fluorine-containing acid amplifier, as discussed in Invention 11, wherein the organic solvent is at least one kind selected from the group consisting of aliphatic hydrocarbons, aromatic hydrocarbons, halogenated hydrocarbons, alcohols, ketones, cyclic ketones, polyalcohols, polyalcohol derivatives, cyclic ethers, chain ethers, esters, sulfonyl esters, amides, aromatic solvents and fluorine-based solvents.

In this specification, the term "dissolve" means forming a homogeneous mixture where the fluorine-containing acid amplifier is dispersed in a solvent and means that undissolved contents are not visually observed.

By preparing a solution of a fluorine-containing acid amplifier according to the present invention, the storage stability is dramatically improved. Additionally, according to the method of preparing the solution of the fluorine-containing acid amplifier of the present invention, the stability is particularly improved by using a specified solvent.

DETAILED DESCRIPTION OF THE INVENTION

Now, each of elements constituting the present invention will be discussed. The present invention is not limited to the following embodiments.

The present invention is a method of dissolving a fluorine-containing acid amplifier represented by general formula (1) in an organic solvent to form a solution (hereinafter, this solution may sometimes be referred to as "an acid amplifier solution") thereby stabilizing the fluorine-containing acid amplifier so that the fluorine-containing acid amplifier is provided suitably for storage <Acid Amplifier>

A fluorine-containing acid amplifier usable in the present invention is a compound represented by general formula (1):

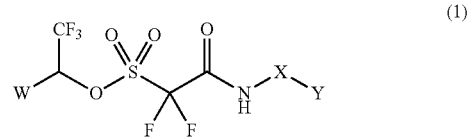

(1)

In the general formula (1), W represents a $C_1$-$C_{20}$ straight-chain or branched saturated or unsaturated hydrocarbon group or a $C_3$-$C_{20}$ cyclic saturated or unsaturated hydrocarbon group, both of which may have a substituent. In the formula, X represents a direct bond, —$(CR^AR^A)_m(O)_n(C=O)_p$— or —$R^B(O)_q(C=O)_r$— where: $R^A$ mutually independently represents a hydrogen atom, a $C_1$-$C_6$ alkyl group or a phenyl group; $R^B$ represents a phenylene group or a cyclohexylene group, in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; r is an integer of 0 or 1. In the formula, Y is selected from the following formulas (a) and (b), and (c).

(a) —C(=$CH_2$)Z (In this formula, Z represents a hydrogen atom, fluorine atom, $CH_3$ group or $CF_3$ group.)

(b) —$C_dH_eF_f$ (In this formula, d is an integer of 1 to 15, e is an integer of 0 to 30, f is an integer of 1 to 31, and the total of e and f is 2d+1)

(c) A $C_3$-$C_{12}$ cyclic saturated or unsaturated hydrocarbon group which may have a substituent Particularly preferable examples of W are $C_1$-$C_5$ alkyl groups, $C_1$-$C_5$ alkenyl groups and $C_3$-$C_6$ cycloalkyl groups, and more specifically, methyl group, ethyl group, n-propyl group, isopropyl group, n-butyl group, isobutyl group, n-pentyl group, propenyl group, isopropenyl group, n-butenyl group, isobutenyl group, cyclopropenyl group, cyclobutyl group, cyclopentyl group, cyclohexyl group and the like. A substituent that these may have is exemplified by alkyl group, alkenyl group, cycloalkyl group and cyclic acetal group. In the case of having a substituent, the number of the substituent may be either one or more. When two or more substituents are used, these may be either equal or different. As concrete examples thereof, it is possible to cite alkyl groups such as methyl group, ethyl group, n-propyl group, isopropyl group and isobutyl group, alkenyl groups such as n-propenyl group, isopropenyl group, n-butenyl group and isobutenyl group, and the like. Among these, substituents having a carbon number of 1 to 4 are preferable.

As a further preferable structure of W, it is possible to cite a structure having a cyclic acetal group as a substituent and a structure having an olefin moiety. More specifically, it is possible to cite structures as follows. In this specification, a line segment accompanied with a wavy line represents a binding site.

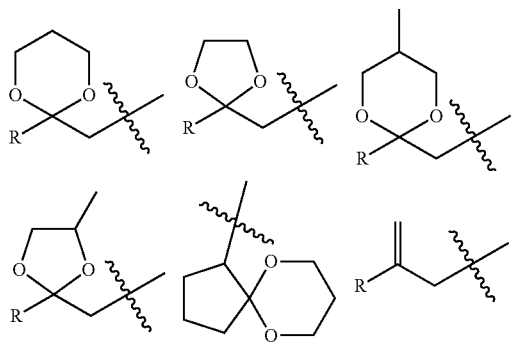

In the above formula, R represents a $C_1$-$C_{18}$ straight-chain or branched saturated or unsaturated hydrocarbon group which may have a substituent. Among $C_1$-$C_{18}$ straight-chain or branched saturated or unsaturated hydrocarbon groups, preferable examples are $C_1$-$C_6$ lower alkyl and alkenyl groups and phenyl group. More preferably, it is possible to cite $C_1$-$C_4$ alkyl groups such as methyl group, ethyl group, n-propyl group, isopropyl group, n-butyl group and isobutyl group, $C_1$-$C_4$ alkenyl groups such as n-propenyl group, isopropenyl group, n-butenyl group and isobutenyl group, and the like. A substituent that these may have is exemplified by alkyl group, alkenyl group and cycloalkyl group. In the case of having a substituent, the number of the substituent may be either one or more. When two or more substituents are used, these may be either equal or different. As concrete examples thereof, it is possible to cite alkyl groups such as methyl group, ethyl group, n-propyl group, isopropyl group and isobutyl group, alkenyl groups such as propenyl group, isopropenyl group and isobutenyl group, and the like. Among these, substituents having a carbon number of 1 to 4 are preferable.

X represents a direct bond, $-(CR^AR^A)_m(O)_n(C=O)_p-$ or $-R^B(O)_q(C=O)_r-$ where: $R^A$ mutually independently represents a hydrogen atom, a $C_1$-$C_6$ alkyl group or a phenyl group; $R^B$ represents a phenylene group or a cyclohexylene group, in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; and r is an integer of 0 or 1.

Particularly preferable examples of Y include $-C(=CH_2)$ Z, phenyl group and adamantyl group. More specifically, it is possible to cite $-C(=CH_2)H$, $-C(=CH_2)F$, $-C(=CH_2)$ $CH_3$, $-C(=CH_2)CF_3$, a substituted or unsubstituted phenyl group and a substituted or unsubstituted adamantyl group. In a case where Y represents a $C_3$-$C_{12}$ cyclic saturated or unsaturated hydrocarbon group, a substituent applicable therein is exemplified by that selected from the group (AB) and the group (AC) as follows. The number of substituents is one in the case of having a substituent selected from the group (AB), and on the other hand it is an integer of 1 to 5 in the case of having a substituent selected from the group (AC). The total number of substituents selected from the groups (AB) and (AC) is 0 to 5. When the number of substituents selected from the group (AC) is two or more, the substituents may be either equal or different.

<Group (AB)>

$-C(=O)OCH_3$ group, $-OC(=O)CH_3$ group, $-C(=O)CH_3$ group, $-CN$ group, $-CH=CH_2$ group, $-OC(=O)CH(=CH_2)$ group, $-OC(=O)CCH_3(=CH_2)$ group <Group (AC)>

$-CF_3$ group, $-OH$ group, $-OCH_3$ group, $-C=O(oxo)$ group, $C_1$-$C_4$ alkyl group, $-NO_2$ group, fluorine atom, $C_1$-$C_4$ fluorinated alkyl group any number of hydrogen atoms of which are substituted with fluorine atoms A moiety indicated with X—Y preferably has a structure represented by the following formulas:

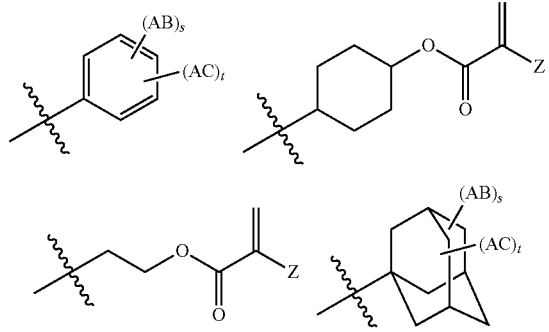

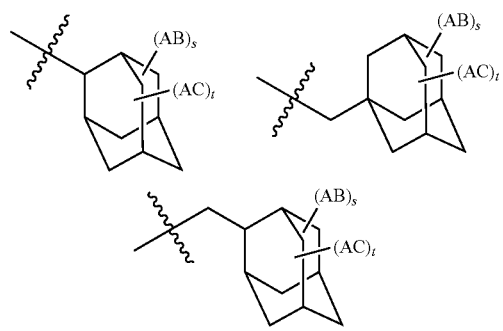

In the structure, groups represented by (AB) and (AC) corresponds to the substituents selected from the above-mentioned groups (AB) and (AC). The number of group (AB), which is represented by s, is an integer of 0 or 1, and the number of (AC) represented by t is an integer of 0 to 5. The total of s and t meets an integer of 0 to 5. In the structure, a line segment accompanied with a wavy line represents a binding site.

Hereinafter, a particularly preferable structure of the fluorine-containing acid amplifier will be described.

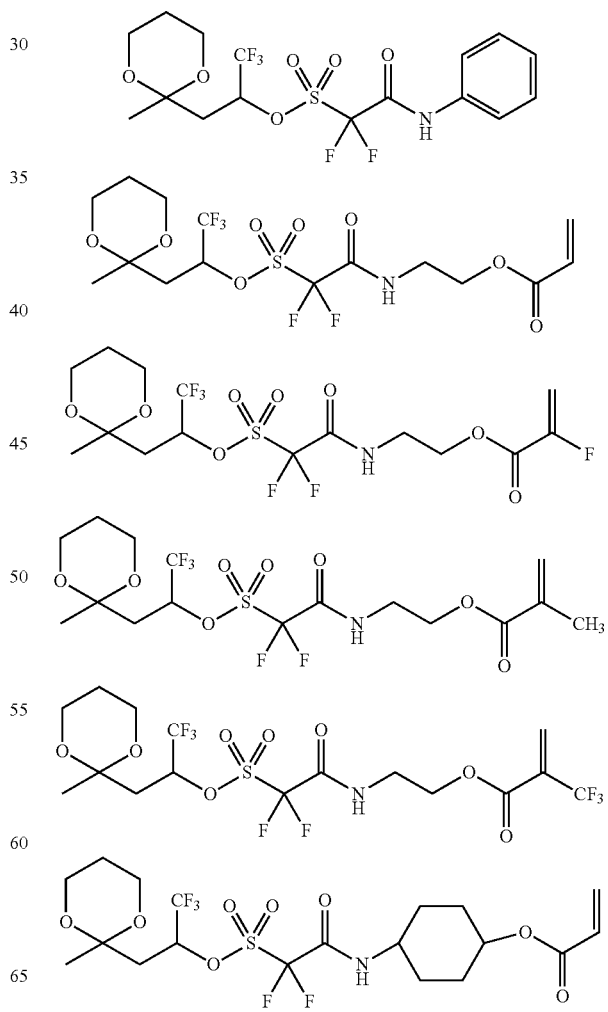

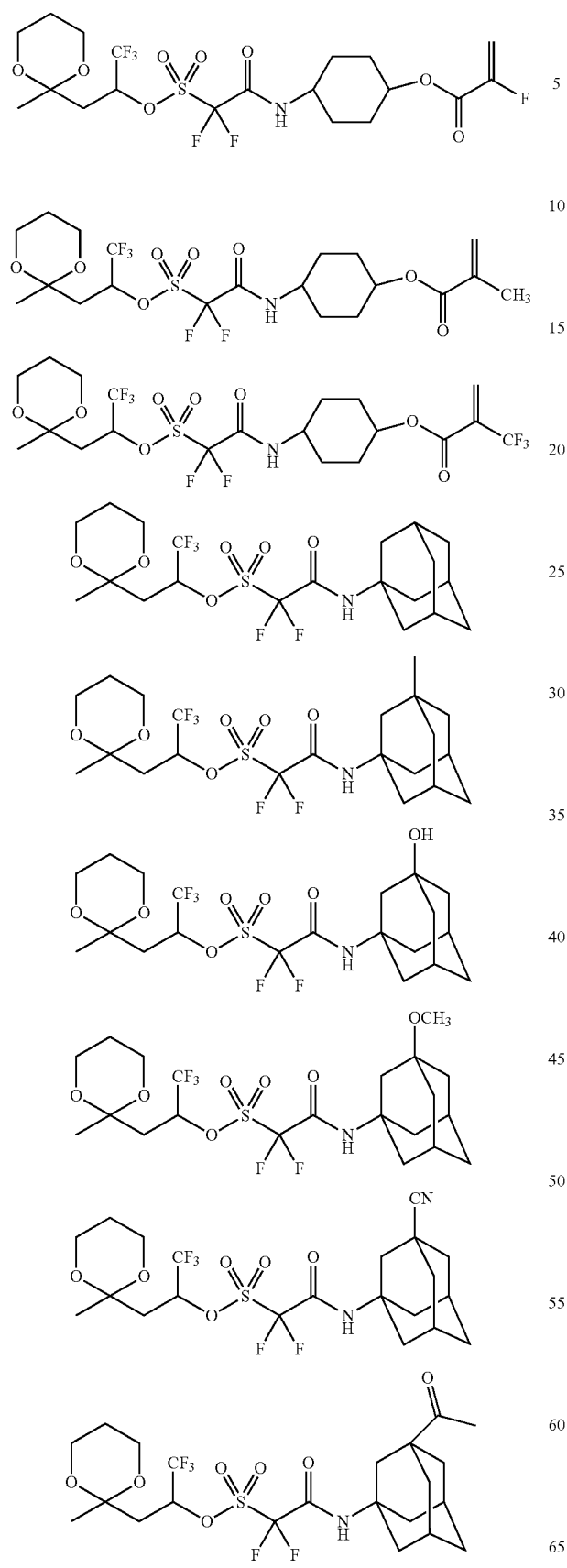
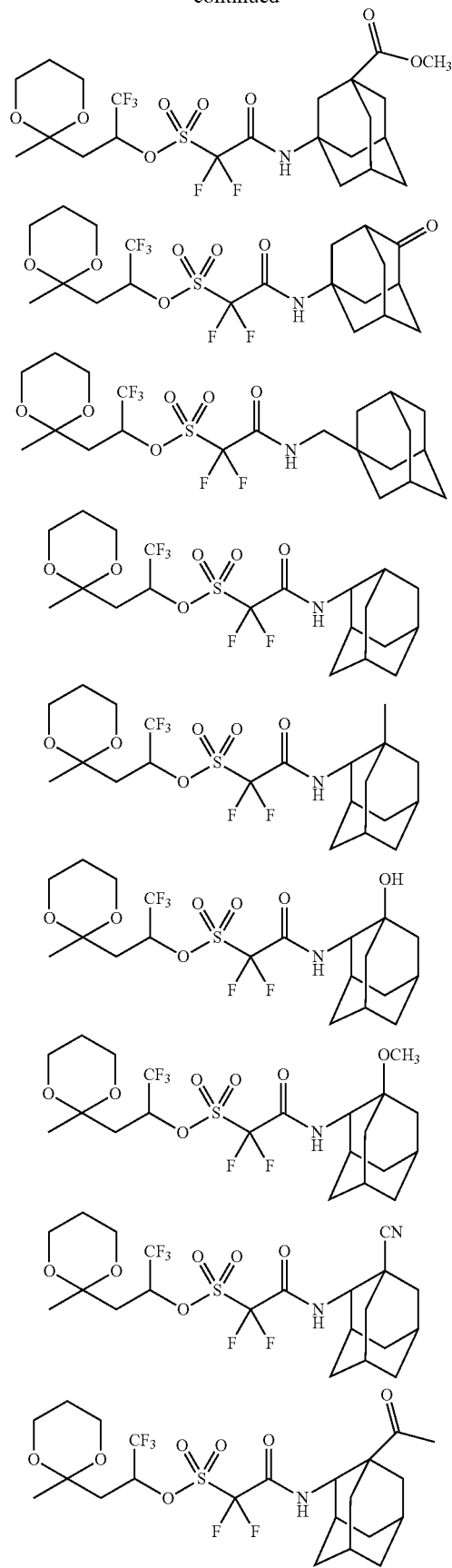

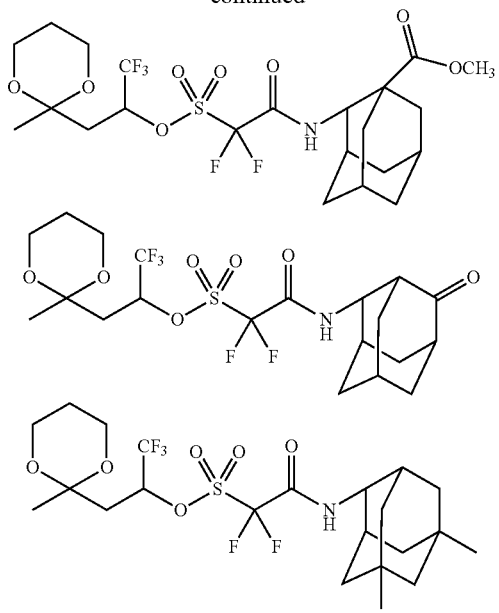

<Solvent>

Now an organic solvent will hereinafter be discussed. An organic solvent to be used for the stabilization method of the present invention is not particularly limited so long as the fluorine-containing acid amplifier can dissolve therein, and exemplified by aliphatic hydrocarbons, aromatic hydrocarbons, halogenated hydrocarbons, alcohols, ketones, cyclic ketones, polyalcohols, polyalcohol derivatives, cyclic ethers, chain ethers, esters, sulfonyl esters, amides, aromatic solvents and fluorine-based solvents. Usable concrete examples are: aliphatic hydrocarbons such as n-hexane, cyclohexane and n-heptane; aromatic hydrocarbons such as benzene, toluene, α,α,α-trifluorotoluene, xylene, ethylbenzene and mesitylene; halogenated hydrocarbons such as methylene chloride, chloroform and 1,2-dichloroethane; alcohols such as methanol, ethanol, n-propyl alcohol, isopropyl alcohol, n-butyl alcohol and tert-butyl alcohol; ketones such as acetone, methyl ethyl ketone (hereinafter, sometimes referred to as "MEK"), methyl n-propyl ketone, methyl isopropyl ketone, methyl n-butyl ketone, pinacolone, diethyl ketone, di-n-propyl ketone, diisopropyl ketone, acetophenone, propiophenone, butyrophenone, methyl isoamyl ketone, 2-heptanone and methyl isobutyl ketone; cyclic ketones such as cyclohexanone, cyclopentanone, cycloheptanone and cyclooctanone; polyalcohols such as ethylene glycol, ethylene glycol monoacetate, diethylene glycol, diethylene glycol monoacetate, propylene glycol, propylene glycol monoacetate, dipropylene glycol and dipropylene glycol monoacetate, and monomethyl ether, monoethyl ether, monopropyl ether, monobutyl ether and monophenyl ether thereof; polyalcohol derivatives such as propylene glycol monomethyl ether acetate (hereinafter, sometimes referred to as "PGMEA"); cyclic ethers such as tetrahydrofuran (hereinafter, sometimes referred to as "THF"), 1,4-dioxane and 2-methyltetrahydrofuran; chain ethers such as diethyl ether, 1,2-dimethoxyethane, diisopropyl ether, methyl-tert-butyl ether, diethylene glycol dimethyl ether and anisole; esters such as methyl lactate, ethyl lactate, methyl acetate, ethyl acetate, butyl acetate, methyl pyruvate, ethyl pyruvate, methyl methoxypropionate and ethyl ethoxypropionate; sulfonyl esters such as dimethyl sulfoxide (DNSO); amides such as N,N-dimethylformamide (DMF) and N,N-dimethylacetamide (DMAC); aromatic solvents such as xylene and toluene; and fluorine-based solvents such as chlorofluorocarbons, alternative chlorofluorocarbons, perfluoro compounds and hexafluoroisopropyl alcohol. These organic solvents can be synthesized by publicly known methods or, alternatively, easily available as reagents. These may be used singly or in combination of two or more kinds. Among these, particularly preferable solvents are MEK, ethyl acetate, ethyl lactate, THF and PGMEA. Furthermore, PGMEA is particularly preferably usable since it is useful from the viewpoint of physical properties such as boiling point and melting point and intended uses of the acid amplifier solution.

<Preparation of Solution>

Then, a method of preparing the acid amplifier solution of the present invention will be discussed. In the solution according to the present invention, the fluorine-containing acid amplifier preferably has a concentration of 0.05 to 90 mass % relative to the total amount of the acid amplifier solution. Preparation of the solution is not limited in the kind of method therefor so long as the fluorine-containing acid amplifier can dissolve in the organic solvent. For example, the solution can be obtained in such a manner as to charge an arbitrary vessel with the fluorine-containing acid amplifier and add the organic solvent thereto and then stir it. The temperature during preparation is not particularly limited and therefore preparation may be conducted at room temperature in ordinary cases.

Usually, the concentration of the fluorine-containing acid amplifier is preferably 0.05 to 90 mass %, but it is more preferably 1 to 50 mass %, much more preferably 5 to 10 mass %. When the concentration of the fluorine-containing acid amplifier is less than 0.05 mass %, the solution is too diluted to practically use. In addition, a concentration of higher than 90 mass % is also not preferable since the solution becomes so rich as to easily occur crystallization in handling.

<Additives>

In order to further improve the stabilizing effect, it is also possible to add an additive to the acid amplifier solution of the present invention. Such an additive may be exemplified by an antioxidant and a basic compound.

As an antioxidant, it is possible to cite ascorbic acid, tocopherol, dibutylhydroxytoluene (BHT), butylated hydroxyanisole (BHA), 1,2,4-trihydroxybenzene, 2,5-bistetramethylbutylhydroquinone, leucoquinizarin, NONFLEX F (Seiko Chemical Co., Ltd. trade name), NONFLEX H (Seiko Chemical Co., Ltd. trade name), NONFLEX DCD (Seiko Chemical Co., Ltd. trade name), NONFLEX MBP (Seiko Chemical Co., Ltd. trade name), OZONONE 35 (Seiko Chemical Co., Ltd. trade name), phenothiazine, 2-methoxyphenothiazine, tetraethylthiuram, 1,1-diphenyl-2-picrylhydrazyl, 1,1-diphenyl-2-picrylhydrazine, sodium erythorbate, isoamyl gallate, propyl gallate, sodium sulfite, sulfur dioxide, catechin, catechol, resorcinol, hydroquinone, pyrogallol, hydroquinone, hydroquinone monomethyl ether, 4-tert-butylcatechol and the like.

As the basic compound, it is possible to use primary, secondary or tertiary aliphatic amines, aromatic amines, heterocyclic amines, nitrogen-containing compounds having hydroxyphenyl group, alcoholic nitrogen-containing compounds, amide derivatives and the like. Among these, tertiary aliphatic amines, aromatic amines and heterocyclic amines are preferably usable. Concrete examples of aliphatic amines include alkyl amines or alkyl alcohol amines obtained by substituting at least one hydrogen atom of ammonia ($NH_3$) with an alkyl group or hydroxyalkyl group having a carbon number not larger than 12. More specifically, it is possible to cite: monoalkyl amines such as n-heptylamine, n-octylamine, n-nonylamine and n-decylamine; dialkyl amines such as diethylamine, di-n-propylamine, di-n-heptylamine, di-n-octylamine and dicyclohexylamine; trialkyl amines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine and tri-n-dodecylamine; and alkyl alcohol amines such as diethanolamine, triethanolamine, diisopropanolamine, triisopropanolamine, di-n-octanolamine and tri-n-octanolamine. As examples of the other basic compounds, it is possible to cite the following compounds. Aromatic amines and heterocyclic amines are exemplified by; aniline and aniline derivatives such as N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine; pyridine and pyridine derivatives such as methylpyridine, 2,6-dimethylpyridine, 2,4,6-trimethylpyridine, tert-butylpyridine, 2,6-di-tert-butylpyridine, 2,4,6-tris(tert-butyl)pyridine; heterocyclic amines such as 1,5-diazabicyclo[4.3.0]non-5-ene, 1,8-diazabicyclo[5.4.0]undec-7-ene, 1,4-diazabicyclo[2.2.2]octane, 4-dimethylaminopyridine, hexamethylenetetramine, 4,4-dimethylimidazoline; hindered amines such as bis(1,2,2,6,6-pentamethyl-4-piperidyl)sebacate; and alcoholic nitrogen-containing compounds such as 2-hydroxypyridine, amino cresol, 2,4-quinolinediol, 3-indole methanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine and 1-[2-(2-hydroxyethoxy)ethyl]piperazine.

In usual cases, the additives preferably have a concentration of 0.001 to 10 mass % relative to the amount of the fluorine-containing acid amplifier. These may be used singly or in combination of two or more kinds. Among these, dibutylhydroxytoluene is particularly preferably used as an antioxidant because of its general versatility and availability. Also preferable are NONFLEX MBP (Seiko Chemical Co., Ltd. trade name), hydroquinone and hydroquinone monomethyl ether. As the basic compound, 2,4,6-tris(tert-butyl)pyridine is particularly preferably used because of its low nucleophilicity. Additionally, 2,6-dimethylpyridine and 2,6-di-tert-butylpyridine are also preferable.

<Method of Storage>

An acid amplifier solution obtained according to the present invention can prevent an acid amplifier from decomposition so as to keep the acid amplifier stable; therefore, though a storage place and a storage temperature are not particularly limited, it is preferable that the storage temperature is −30 to +50° C. in ordinary cases, and more preferably 5 to 40° C. in order to store the amplifier easier.

EXAMPLES

Hereinafter, the present invention will be explained with reference to examples; however, the present invention is not limited to these examples.

Reference Examples

Examples of a method of synthesizing a fluorine-containing acid amplifier will be discussed.

Reference Example 1

A 200 ml round-bottom flask provided having a thermocouple and a dropping funnel was charged with 5 g (23 mmol) of 1,1,1-trifluoro-3-(2-methyl-1,3-dioxan-2-yl)propan-2-ol and 40 g of diisopropyl ether. To the flask, 24.5 ml of 1 mol/L lithium diisopropylamide was added dropwise over 30 minutes in a nitrogen atmosphere at −30° C. or lower (thereby obtaining a solution "A"). The solution was stirred for 30 minutes after the termination of the dropwise addition, followed by increasing the temperature of the solution to room temperature and then stirring it for additional 1 hour. Another 200 ml round-bottom flask provided having a thermocouple and a dropping funnel was charged with 6.5 g of 1,1-difluoro-2-oxo-2-(phenylamino)ethanesulfonyl fluoride and 30 g of diisopropyl ether and cooled to −30° C. in a nitrogen atmosphere. To this solution, the previously prepared solution "A" was added dropwise by using the dropping funnel to such an extent as not to exceed an inner temperature of −20° C. The solution was stirred for 30 minutes after the termination of the dropwise addition, followed by increasing the temperature of the solution to room temperature and then stirring it for additional 3 hours. Thereafter, 40 g of ethyl acetate was added thereto, and then 30 ml of 5% aqueous hydrochloric acid solution was added. An organic phase was separated by using a separatory funnel, followed by rinsing with 30 ml of a saturated aqueous sodium hydrogen carbonate solution and then repeating rinsing with 30 ml of water three times. Distillation of a solvent was performed, and then filtration was performed when crystallization was confirmed, thereby obtaining 5.2 g of a crude crystal. This crystal was recrystallized with 50 g of a 1:1 (mass ratio) mixture solution of ethyl acetate and diisopropyl ether thereby obtaining 2.9 g of a target 1,1,1-trifluoro-3-(2-methyl-1,3-dioxan-2-yl)propan-2-yl1,1-difluoro-2-oxo-2-(phenylamino)ethanesulfonate (hereinafter referred to as "AA-1"). As a result of analyzing this compound by high performance liquid chromatography, it was confirmed that the purity was 99.6%. Additionally, the yield was 28%.

The structural formula of AA-1 will be shown below.

AA-1

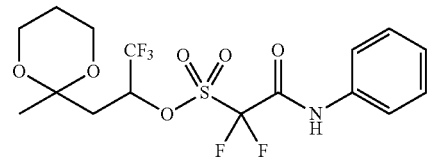

Reference Example 2

A 200 ml round-bottom flask provided having a thermocouple and a dropping funnel was charged with 5 g (23 mmol) of 1,1,1-trifluoro-3-(2-methyl-1,3-dioxan-2-yl)propan-2-ol and 40 g of diisopropyl ether. To the flask, 24.5 ml of 1 mol/L lithium diisopropylamide was added dropwise over 30 minutes in a nitrogen atmosphere at −30° C. or lower (thereby obtaining a solution "B"). The solution was stirred for 30 minutes after the termination of the dropwise addition, followed by increasing the temperature of the solution to room temperature and then stirring it for additional 1 hour. Another 200 ml round-bottom flask provided having a thermocouple and a dropping funnel was charged with 7.4 g of 2-(2,2-difluoro-2-fluorosulfonyl)acetamide)ethyl methacrylte and 30 g of diisopropyl ether and cooled to −30° C. in a nitrogen atmosphere. To this solution, the previously prepared solution "B" was added dropwise by using the dropping funnel to such an extent as not to exceed an inner temperature of −20° C. The solution was stirred for 30 minutes after the termination of the dropwise addition, followed by increasing the temperature of the solution to room temperature and then stirring it for additional 3 hours. Thereafter, 40 g of ethyl acetate was added thereto, and then 30 ml of 5% aqueous hydrochloric acid solution was added. An organic phase was separated by using a separatory funnel, followed by rinsing with 30 ml of a saturated aqueous sodium hydrogen carbonate solution and then repeating rinsing with 30 ml of water three times. Distillation of a solvent was performed, and then filtration was performed when crystallization was confirmed, thereby obtaining 6.5 g of a crude crystal. This crystal was recrystallized with 50 g of a 1:1 (mass ratio) mixture solution of ethyl acetate and diisopropyl ether thereby obtaining 3.1 g of a target 2,2-difluoro-2-(1,1,1-trifluoro-3-(2-methyl-1,3-dioxan-2-yl)propan-2-yl oxosulfonyl)acetamide)ethyl methacrylate (hereinafter referred to as "AA-2"). As a result of analyzing this compound by high performance liquid chromatography, it was confirmed that the purity was 98.8%. Additionally, the yield was 28%.

The structural formula of AA-2 will be shown below.

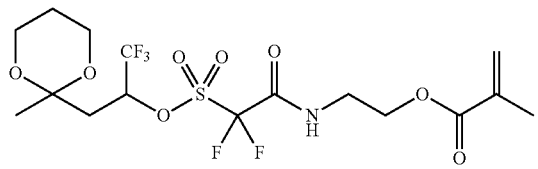

AA-2

Reference Example 3

A 200 ml round-bottom flask provided having a thermocouple and a dropping funnel was charged with 5 g (23 mmol) of 1,1,1-trifluoro-3-(2-methyl-1,3-dioxan-2-yl)propan-2-ol and 40 g of diisopropyl ether. To the flask, 24.5 ml of 1 mol/L lithium diisopropylamide was added dropwise over 30 minutes in a nitrogen atmosphere at −30° C. or lower (thereby obtaining a solution "C"). The solution was stirred for 30 minutes after the termination of the dropwise addition, followed by increasing the temperature of the solution to room temperature and then stirring it for additional 1 hour. Another 200 ml round-bottom flask provided having a thermocouple and a dropping funnel was charged with 8.0 g of 2-(adamant-1-ylamino)-1,1-difluoro-2-oxoethanesulfonyl fluoride and 30 g of tetrahydrofuran and cooled to −30° C. in a nitrogen atmosphere. To this solution, the previously prepared solution "C" was added dropwise by using the dropping funnel to such an extent as not to exceed an inner temperature of −20° C. The solution was stirred for 30 minutes after the termination of the dropwise addition, followed by increasing the temperature of the solution to room temperature and then stirring it for additional 3 hours. Thereafter, 50 g of ethyl acetate was added thereto, and then 30 ml of 5% aqueous hydrochloric acid solution was added. An organic phase was separated by using a separatory funnel, followed by rinsing with 30 ml of a saturated aqueous sodium hydrogen carbonate solution and then repeating rinsing with 30 ml of water three times. Distillation of a solvent was performed, and then filtration was performed when crystallization was confirmed, thereby obtaining 8.9 g of a crude crystal. This crystal was recrystallized with 50 g of ethyl acetate thereby obtaining 7.1 g of a target 1,1,1-trifluoro-3-(2-methyl-1,3-dioxan-2-yl)propan-2-yl 2-(adamant -1-ylamino)-1,1-difluoro-2-oxoethanesulfonate (hereinafter referred to as "AA-3"). As a result of analyzing this compound by high performance liquid chromatography, it was confirmed that the purity was 98.8%. Additionally, the yield was 60%.

The structural formula of AA-3 will be shown below.

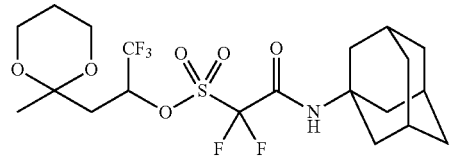

AA-3

Example 1

Stabilization of AA-1 Storage by Dissolution

A solution obtained by dissolving AA-1 (0.5 g) in 4.5 g of propylene glycol monomethyl ether acetate (PGMEA) was stored at 40° C. After a lapse of 30 days, its behavior was determined by $^{19}F$ NMR. As a result, it was found that decomposition was not developed even after the lapse of 30 days.

[Properties of AA-1]

$^{19}F$ NMR (Measurement solvent: Deuterated acetone, Standard substance: Trichlorofluoromethane); δ=−77.7 (s, 3F), −107.4 (dd, J=123 Hz, 2F)

Example 2

Stabilization of AA-1 Storage by Dissolution

A solution obtained by dissolving AA-1 (0.5 g) in 4.5 g of propylene glycol monomethyl ether acetate (PGMEA) was stored at 5° C. After a lapse of 30 days, its behavior was determined by $^{19}F$ NMR. As a result, it was found that decomposition was not developed even after the lapse of 30 days.

Example 3

Stabilization of AA-1 Storage by Dissolution

A solution obtained by dissolving AA-1 (0.5 g) in 9.5 g of propylene glycol monomethyl ether acetate (PGMEA) was stored at 5° C. After a lapse of 30 days, its behavior was determined by $^{19}F$ NMR. As a result, it was found that decomposition was not developed even after the lapse of 30 days.

Example 4

Stabilization of AA-1 Storage by Dissolution

A solution obtained by dissolving AA-1 (0.1 g) in 0.9 g of tetrahydrofuran (THF) containing 200 ppm of dibutylhydroxytoluene (BHT) as an antioxidant was stored at 40° C. After a lapse of 30 days, its behavior was determined by $^{19}F$ NMR. As a result, it was found that decomposition was not developed even after the lapse of 30 days.

Example 5

Stabilization of AA-1 Storage by Dissolution

A solution obtained by dissolving AA-1 (0.1 g) in 0.9 g of ethyl acetate was stored at 40° C. After a lapse of 30 days, its behavior was determined by $^{19}$F NMR. As a result, it was found that decomposition was not developed even after the lapse of 30 days.

Example 6

Stabilization of AA-1 Storage by Dissolution

A solution obtained by dissolving AA-1 (0.1 g) in 0.9 g of methyl ethyl ketone (MEK) was stored at 40° C. After a lapse of 30 days, its behavior was determined by $^{19}$F NMR. As a result, it was found that decomposition was not developed even after the lapse of 30 days.

Example 7

Stabilization of AA-1 Storage by Dissolution

A solution obtained by dissolving AA-1 (0.1 g) in 0.9 g of ethyl lactate was stored at 40° C. After a lapse of 30 days, its behavior was determined by $^{19}$F NMR. As a result, it was found that decomposition was not developed even after the lapse of 30 days.

Example 8

Stabilization of AA-1 Storage by Dissolution

A solution obtained by dissolving AA-1 (0.1 g) in 0.9 g of tetrahydrofuran (THF) not containing an antioxidant was stored at 40° C. After a lapse of 30 days, its behavior was determined by $^{19}$F NMR. As a result, it was found that decomposition was not developed even after a lapse of 3 days. Thereafter, the solution was stored for additional 5 days. After a lapse of 5 days, the solution got browned and therefore its behavior was determined by $^{19}$F NMR. As a result, a distinctive double doublet (dd) that had been observed in the vicinity of −107 ppm was confirmed disappeared and only a singlet was observed in the vicinity of −110 ppm, with which it was found that the decomposition was developed.

Example 9

Stabilization of AA-2 Storage by Dissolution

A solution obtained by dissolving AA-2 (0.5 g) in 9.5 g of propylene glycol monomethyl ether acetate (PGMEA) was stored at 5° C. After a lapse of 30 days, its behavior was determined by $^{19}$F NMR. As a result, it was found that decomposition was not developed even after the lapse of 30 days.
[Properties of AA-2]
$^{19}$F NMR (Measurement solvent: Deuterated acetone, Standard substance: Trichlorofluoromethane); δ=−78.1 (s, 3F), −107.8 (dd, J=240 Hz, J=680 Hz, 2F)

Example 10

Stabilization of AA-2 Storage by Dissolution

A solution obtained by dissolving AA-2 (0.5 g) in 9.5 g of propylene glycol monomethyl ether acetate (PGMEA) was stored at 40° C. After a lapse of 30 days, its behavior was determined by $^{19}$F NMR. As a result, it was found that decomposition was not developed even after the lapse of 30 days.

Example 11

Stabilization of AA-2 Storage by Dissolution

A solution obtained by dissolving AA-2 (0.2 g) in 1.8 g of ethyl acetate was stored at 40° C. After a lapse of 30 days, its behavior was determined by $^{19}$F NMR. As a result, it was found that decomposition was not developed even after the lapse of 30 days.

Example 12

Stabilization of AA-2 Storage by Dissolution

A solution obtained by dissolving AA-2 (0.2 g) in 1.8 g of tetrahydrofuran (THF) containing 200 ppm of dibutylhydroxytoluene (BHT) as an antioxidant was stored at 40° C. After a lapse of 30 days, its behavior was determined by $^{19}$F NMR. As a result, it was found that decomposition was not developed even after the lapse of 30 days.

Example 13

Stabilization of AA-3 Storage by Dissolution

A solution obtained by dissolving AA-3 (0.5 g) in 9.5 g of propylene glycol monomethyl ether acetate (PGMEA) was stored at 5° C. After a lapse of 30 days, its behavior was determined by $^{19}$F NMR. As a result, it was found that decomposition was not developed even after the lapse of 30 days.
[Properties of AA-3]
$^{19}$F NMR (Measurement solvent: Deuterated acetone, Standard substance: Trichlorofluoromethane); δ=−77.7 (s, 3F), −106.7 (dd, J=250 Hz, J=882 Hz, 2F)

Example 14

Stabilization of AA-3 Storage by Dissolution

A solution obtained by dissolving AA-3 (0.5 g) in 9.5 g of propylene glycol monomethyl ether acetate (PGMEA) was stored at 40° C. After a lapse of 30 days, its behavior was determined by $^{19}$F NMR. As a result, it was found that decomposition was not developed even after the lapse of 30 days.

Example 15

Stabilization of AA-3 Storage by Dissolution

A solution obtained by dissolving AA-3 (0.2 g) in 1.8 g of ethyl acetate was stored at 40° C. After a lapse of 30 days, its behavior was determined by $^{19}$F NMR. As a result, it was found that decomposition was not developed even after the lapse of 30 days.

Example 16

Stabilization of AA-3 Storage by Dissolution

A solution obtained by dissolving AA-3 (0.2 g) in 1.8 g of tetrahydrofuran (THF) containing 200 ppm of dibutylhydroxytoluene (BHT) as an antioxidant was stored at 40° C.

After a lapse of 30 days, its behavior was determined by $^{19}$F NMR. As a result, it was found that decomposition was not developed even after the lapse of 30 days.

Comparative Example 1

Storage Stability of AA-1

In a refrigerator, AA-1 (a white crystal) was stored as it was or in a state of solid. One month later, the refrigerated AA-1 was found discolored brown and therefore exhibited the sign of decomposition. As a result of determining its behavior by $^{19}$F NMR, a double doublet (dd) in the vicinity of −107 ppm and a singlet in the vicinity of −110 ppm were detected, from which integral ratio it was confirmed that AA-1 had decomposed in an amount of about 3%. A peak in the vicinity of −77 ppm was considered difficult to be identified since many peaks occurred thereby, so that the decomposition rate was calculated from peaks of −107 to −110 ppm.

Comparative Example 2

Storage Stability of AA-1

At room temperature, AA-1 (a white crystal) was stored as it was or in a state of solid. Decomposition was not observed 3 days later, but 5 days later a partial black discoloration was observed, and further, 7 days later the sample completely turned black and therefore it was confirmed to cause decomposition.

Comparative Example 3

Storage Stability of AA-1

At a temperature of 40° C., AA-1 (a white crystal) was stored as it was or in a state of solid. After a lapse of 1 day, AA-1 was decomposed and turned tarry black.

Comparative Example 4

Storage Stability of AA-2

In a refrigerator, AA-2 (a white crystal) was stored as it was or in a state of solid. One month later, the refrigerated AA-2 was found discolored light brown and therefore suspected to have decomposed. As a result of determining its behavior by $^{19}$F NMR, a distinctive double doublet (dd) that had been observed in the vicinity of −107 ppm was confirmed disappeared and only a singlet was observed in the vicinity of −110 ppm, with which it was found that the decomposition was developed.

Comparative Example 5

Storage Stability of AA-2

At room temperature, AA-2 (a white crystal) was stored as it was or in a state of solid. Decomposition was not observed 3 days later, but 5 days later a partial black discoloration was observed, and further, 7 days later the sample completely turned black and therefore it was confirmed to cause decomposition.

Comparative Example 6

Storage Stability of AA-2

At a temperature of 40° C., AA-2 (a white crystal) was stored as it was or in a state of solid. After a lapse of 1 day, AA-2 was decomposed and turned tarry black.

Comparative Example 7

Storage Stability of AA-3

In a refrigerator, AA-3 (a white crystal) was stored as it was or in a state of solid. One month later, the refrigerated AA-3 was found discolored light brown and therefore suspected to have decomposed. As a result of determining its behavior by $^{19}$F NMR, a distinctive double doublet (dd) that had been observed in the vicinity of −107 ppm was confirmed disappeared and only a singlet was observed in the vicinity of −110 ppm, with which it was found that the decomposition was developed.

Comparative Example 8

Storage Stability of AA-3

At room temperature, AA-3 (a white crystal) was stored as it was or in a state of solid. Decomposition was not observed 3 days later, but 5 days later a partial black discoloration was observed, and further, 7 days later the sample completely turned black and therefore it was confirmed to cause decomposition.

Comparative Example 9

Storage Stability of AA-3

At a temperature of 40° C., AA-3 (a white crystal) was stored as it was or in a state of solid. After a lapse of 1 day, AA-3 was decomposed and turned tarry black.

Examples and Comparative Examples are summarized in Table 1 as follows.

TABLE 1

| | Solvent | Concentration of Fluorine-containing Acid Amplifier (mass %) | Storage Temperature (° C.) | Number of Days Elapsed[*2] | | | | | | |
|---|---|---|---|---|---|---|---|---|---|---|
| | | | | 0 | 1 | 5 | 7 | 10 | 20 | 30 |
| Example 1 | PGMEA | 10 | 40 | A | A | A | A | A | A | A |
| Example 2 | PGMEA | 10 | 5 | A | A | A | A | A | A | A |
| Example 3 | PGMEA | 5 | 5 | A | A | A | A | A | A | A |
| Example 4 | THF[*1] | 10 | 40 | A | A | A | A | A | A | A |
| Example 5 | Ethyl Acetate | 10 | 40 | A | A | A | A | A | A | A |
| Example 6 | MEK | 10 | 40 | A | A | A | A | A | A | A |
| Example 7 | Ethyl Lactate | 10 | 40 | A | A | A | A | A | A | A |

TABLE 1-continued

| | Solvent | Concentration of Fluorine-containing Acid Amplifier (mass %) | Storage Temperature (° C.) | Number of Days Elapsed[*2] | | | | | | |
|---|---|---|---|---|---|---|---|---|---|---|
| | | | | 0 | 1 | 5 | 7 | 10 | 20 | 30 |
| Example 8 | THF | 10 | 40 | A | A | C | — | — | — | — |
| Example 9 | PGMEA | 5 | 5 | A | A | A | A | A | A | A |
| Example 10 | PGMEA | 5 | 40 | A | A | A | A | A | A | A |
| Example 11 | Ethyl Acetate | 10 | 40 | A | A | A | A | A | A | A |
| Example 12 | THF[*1] | 10 | 40 | A | A | A | A | A | A | A |
| Example 13 | PGMEA | 5 | 5 | A | A | A | A | A | A | A |
| Example 14 | PGMEA | 5 | 40 | A | A | A | A | A | A | A |
| Example 15 | Ethyl Acetate | 10 | 40 | A | A | A | A | A | A | A |
| Example 16 | THF[*1] | 10 | 40 | A | A | A | A | A | A | A |
| Comparative Example 1 | No Solvent | — | 5 | A | A | A | A | A | A | B |
| Comparative Example 2 | No Solvent | — | Room Temperature | A | A | B | C | — | — | — |
| Comparative Example 3 | No Solvent | — | 40 | A | C | — | — | — | — | — |
| Comparative Example 4 | No Solvent | — | 5 | A | A | A | A | A | A | B |
| Comparative Example 5 | No Solvent | — | Room Temperature | A | A | B | C | — | — | — |
| Comparative Example 6 | No Solvent | — | 40 | A | C | — | — | — | — | — |
| Comparative Example 7 | No Solvent | — | 5 | A | A | A | A | A | A | B |
| Comparative Example 8 | No Solvent | — | Room Temperature | A | A | B | C | — | — | — |
| Comparative Example 9 | No Solvent | — | 40 | A | C | — | — | — | — | — |

[*1]THF containing antioxidant (BHT) was used.
[*2]A: No Decomposed, B: Partially Decomposed, C: Decomposed, —: No Data

INDUSTRIAL APPLICABILITY

A method of stabilizing a fluorine-containing acid amplifier by preparing it in the form of solution, according to the present invention is useful as a method of stabilizing a resist additive for use in photolithography.

What is claimed is:

1. A method of stabilizing a fluorine-containing acid amplifier, comprising the steps of:
    dissolving a fluorine-containing acid amplifier in an organic solvent thereby producing a solution of the fluorine-containing acid amplifier,
    wherein the solution consists of the fluorine-containing acid and the organic solvent, and
    wherein the fluorine-containing acid amplifier is represented by general formula (1):

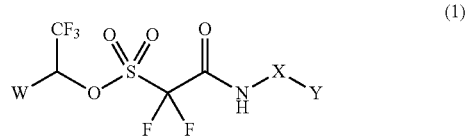

(1)

where
W represents a $C_1$-$C_{20}$ straight-chain or branched saturated or unsaturated hydrocarbon group or a $C_3$-$C_{20}$ cyclic saturated or unsaturated hydrocarbon group, both of which may have a substituent,
X represents a direct bond, —$(CR^4R^4)_m(O)_n(C=O)_p$— or —$R^B(O)_q(C=O)_r$— where: $R^4$ mutually independently represents a hydrogen atom, a $C_1$-$C_6$ alkyl group or a phenyl group; $R^B$ represents a phenylene group or cyclohexylene group in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; r is an integer of 0 or 1, and Y is selected from formulas (a) and (b) and (c):
  (a) —$C(=CH_2)Z$, where Z represents a hydrogen atom, fluorine atom, $CH_3$ group or $CF_3$ group;
  (b) —$C_dH_eF_f$, where d is an integer of 1 to 15, e is an integer of 0 to 30, f is an integer of 1 to 31, and the total of e and f is 2d+1; and
  (c) a $C_3$-$C_{12}$ cyclic saturated or unsaturated hydrocarbon group which may have a substituent.

2. A method of stabilizing a fluorine-containing acid amplifier, as claimed in claim 1, wherein a moiety indicated with W in the fluorine-containing acid amplifier represented by general formula (1) has a structure represented by the following formulas:

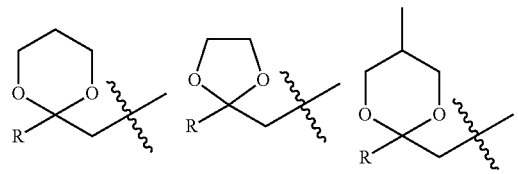

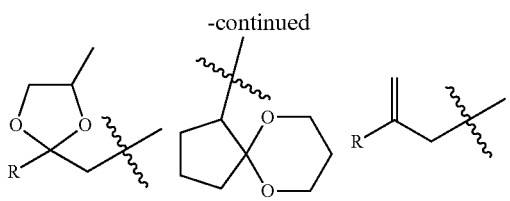

where R represents a $C_1$-$C_{18}$ straight-chain or branched saturated or unsaturated hydrocarbon group which may have a substituent, and a line segment accompanied with a wavy line represents a binding site.

3. A method of stabilizing a fluorine-containing acid amplifier, as claimed in claim 1, wherein a moiety indicated with X—Y in the fluorine-containing acid amplifier represented by general formula (1) has a structure represented by the following formulas:

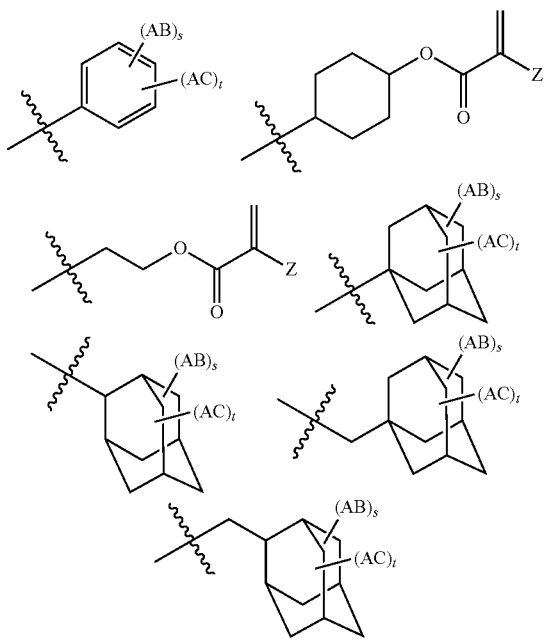

where
AB represents —C(=O)OCH$_3$ group, —OC(=O)CH$_3$ group, —C(=O)CH$_3$ group, —CN group, —CH=CH$_2$ group, —OC(=O)CH(=CH$_2$) group or —OC(=O)CCH$_3$(=CH$_2$) group,
AC represents —CF$_3$ group, —OH group, —OCH$_3$ group, —C=O(oxo) group, $C_1$-$C_4$ alkyl group, —NO$_2$ group, fluorine atom or a $C_1$-$C_4$ alkyl group any number of hydrogen atoms of which are substituted with fluorine atoms,
s which represents the number of AB is an integer of 0 or 1,
t which represents the number of AC is an integer of 0 to 5,
the total of s and t meets an integer of 0 to 5, and
a line segment accompanied with a wavy line represents a binding site.

4. A method of stabilizing a fluorine-containing acid amplifier, as claimed in claim 1, wherein the organic solvent is at least one kind selected from the group consisting of aliphatic hydrocarbons, aromatic hydrocarbons, halogenated hydrocarbons, alcohols, ketones, cyclic ketones, polyalcohols, polyalcohol derivatives, cyclic ethers, chain ethers, esters, sulfonyl esters, amides, aromatic solvents and fluorine-based solvents.

5. A method of stabilizing a fluorine-containing acid amplifier, as claimed in claim 1, wherein the fluorine-containing acid amplifier contained in the solution of the fluorine-containing acid amplifier has a concentration of 0.05 to 90 mass %.

6. A method of stabilizing a fluorine-containing acid amplifier, as claimed in claim 1, wherein a storage temperature is −30 to +50° C.

7. A method of stabilizing a fluorine-containing acid amplifier, as claimed in claim 1, wherein the concentration of the fluorine-containing acid amplifier in the fluorine-containing acid amplifier solution is 1 to 50 mass %.

8. A method of stabilizing a fluorine-containing acid amplifier, as claimed in claim 1, wherein the concentration of the fluorine-containing acid amplifier in the fluorine-containing acid amplifier solution is 5 to 10 mass %.

9. A method of stabilizing a fluorine-containing acid amplifier, as claimed in claim 1, wherein the fluorine-containing acid amplifier represented by general formula (1) has any one of the following structures:

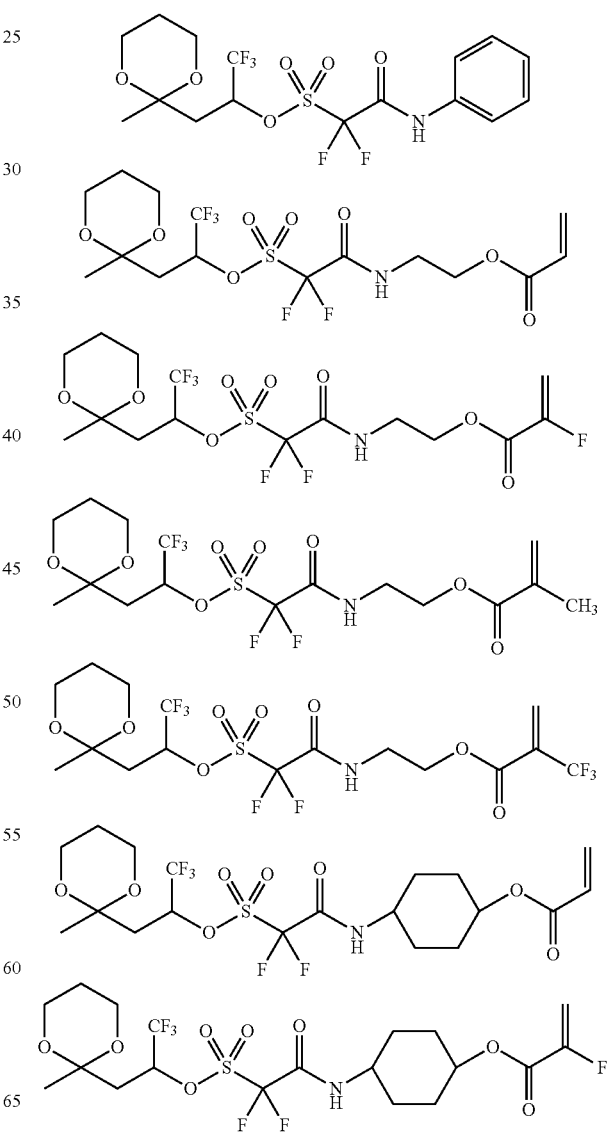

25
-continued
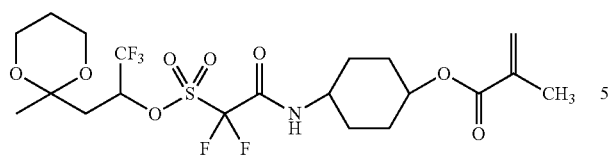
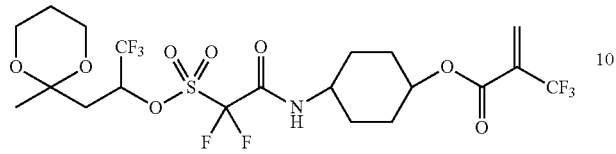
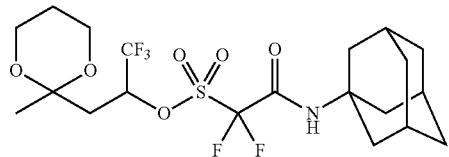
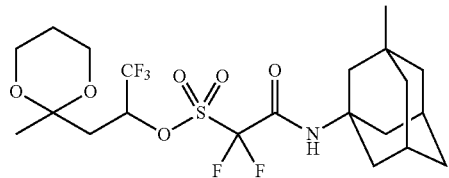
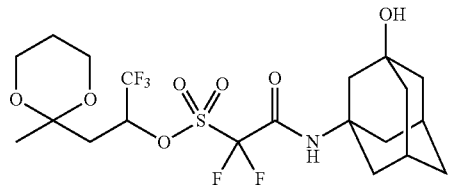
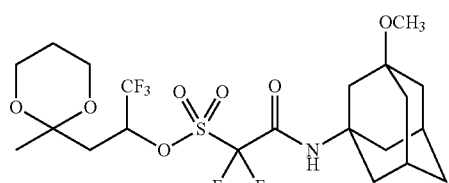
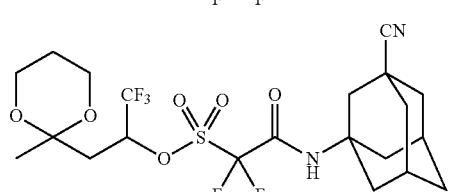
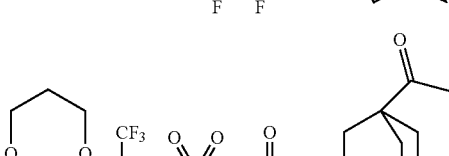
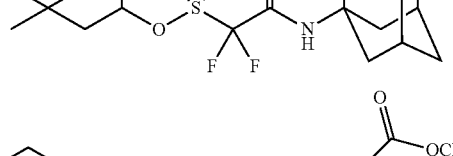
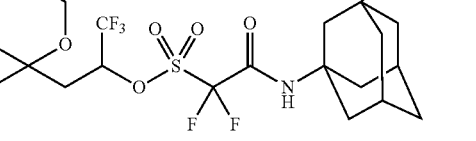
26
-continued
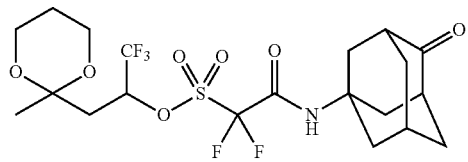
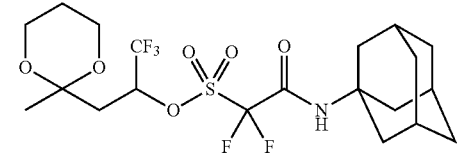
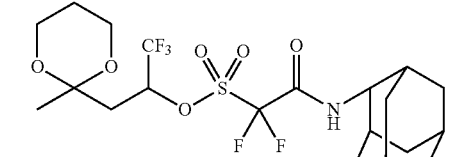
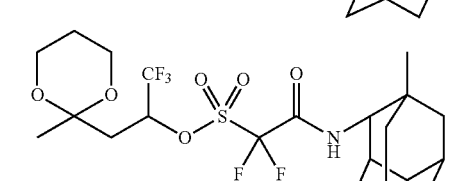
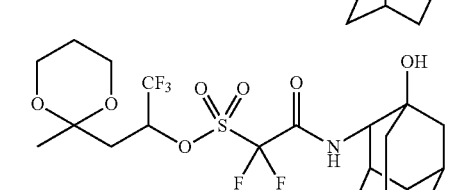
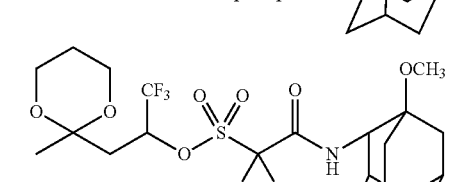
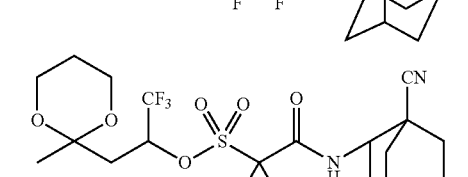
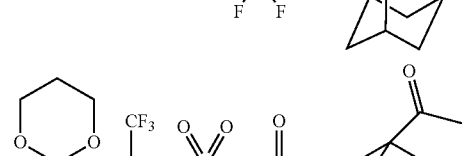
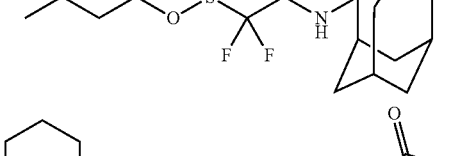
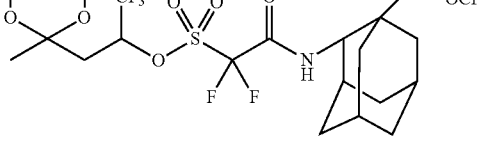

-continued

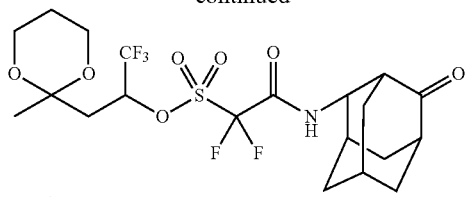

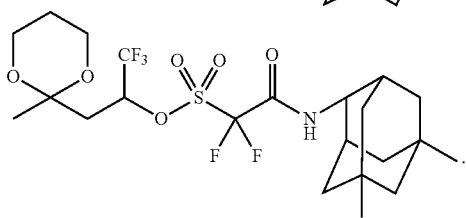

10. A method of stabilizing a fluorine-containing acid amplifier, as claimed in claim 1, wherein the fluorine-containing acid amplifier represented by general formula (1) has any one of the following structures:

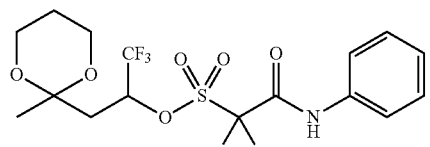

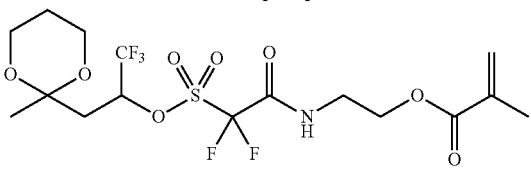

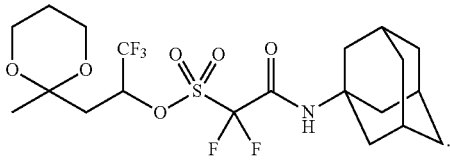

11. A solution of a fluorine-containing acid amplifier consisting of:
a fluorine-containing acid amplifier; and
an organic solvent,
wherein the fluorine-containing acid amplifier is represented by general formula (1):

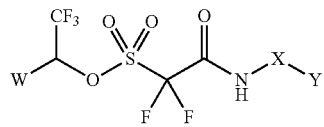

(1)

where

W represents a $C_1$-$C_{20}$ straight-chain or branched saturated or unsaturated hydrocarbon group or a $C_3$-$C_{20}$ cyclic saturated or unsaturated hydrocarbon group, both of which may have a substituent, X represents a direct bond, —$(CR^A R^A)_m(O)_n(C=O)_p$— or —$R^B(O)_q(C=O)_r$— where: $R^A$ mutually independently represents a hydrogen atom, a $C_1$-$C_6$ alkyl group or a phenyl group; $R^B$ represents a phenylene group or a cyclohexylene group, in which any number of hydrogen atoms may be substituted with fluorine atoms, $C_1$-$C_4$ alkyl groups or $C_1$-$C_4$ fluorinated alkyl groups any number of hydrogen atoms of which are substituted with fluorine atoms; m is an integer of 0 to 4; n is an integer of 0 or 1; p is an integer of 0 or 1; q is an integer of 0 or 1; r is an integer of 0 or 1, and Y is selected from formulas (a) and (b) and (c):
(a) —$C(=CH_2)Z$, where Z represents a hydrogen atom, fluorine atom, $CH_3$ group or $CF_3$ group;
(b) —$C_d H_e F_f$, where d is an integer of 1 to 15, e is an integer of 0 to 30, f is an integer of 1 to 31, and the total of e and f is 2d+1; and
(c) a $C_3$-$C_{12}$ cyclic saturated or unsaturated hydrocarbon group which may have a substituent.

12. A solution of a fluorine-containing acid amplifier, as claimed in claim 11, wherein the organic solvent is at least one kind selected from the group consisting of aliphatic hydrocarbons, aromatic hydrocarbons, halogenated hydrocarbons, alcohols, ketones, cyclic ketones, polyalcohols, polyalcohol derivatives, cyclic ethers, chain ethers, esters, sulfonyl esters, amides, aromatic solvents and fluorine-based solvents.

13. A solution of a fluorine-containing acid amplifier, as claimed in claim 11, wherein the concentration of the fluorine-containing acid amplifier in the fluorine-containing acid amplifier solution is 0.05 to 90 mass %.

14. A solution of a fluorine-containing acid amplifier, as claimed in claim 11, wherein the concentration of the fluorine-containing acid amplifier in the fluorine-containing acid amplifier solution is 5 to 10 mass %.

* * * * *